United States Patent [19]

Ugolnikov et al.

[11] 4,039,945
[45] Aug. 2, 1977

[54] DEVICE FOR MEASURING AND CHECKING PARAMETERS OF ELECTRIC CIRCUIT ELEMENTS

[76] Inventors: Stanislav Vasilievich Ugolnikov, ulitsa Narodnogo Opolchenia, 45, kv. 61; Stanislav Petrovich Kosach, ulitsa Masterovaya, 11, kv. 19; Vladimir Davydovich Kaplun, ulitsa Kutuzova, 1, kv. 30, all of Moscow; Valentin Ivanovich Zhitnik, prospekt Lenina, 44, kv. 26; Anatoly Yakovlevich Bulgakov, ulitsa Sverdlova, 31, kv. 4, both of Zaporozhie, all of U.S.S.R.

[21] Appl. No.: 597,889

[22] Filed: July 21, 1975

[51] Int. Cl.$^2$ .................. G01R 31/22; G01R 27/00
[52] U.S. Cl. .......................... 324/158 R; 324/57 R; 324/73 R; 324/158 T
[58] Field of Search ............ 324/158 R, 73 R, 158 T, 324/57 R

[56] References Cited
U.S. PATENT DOCUMENTS

3,833,853  9/1974  Milford .......................... 324/73 R

Primary Examiner—Rudolph V. Rolinec
Assistant Examiner—Ernest F. Karlsen

[57] ABSTRACT

A device for measuring and checking parameters of elements of electric circuits having at least three elements forming a closed loop, comprising a testing signal source whose output is intended to be connected to a first lead of a first element being checked, a first operational amplifier, a first group of auxiliary amplifiers whose inputs are intended to be connected to the remaining leads of the first element being checked, and at least one operational amplifier of a second group, whose input is intended to be connected to a first lead of at least one second element of the electric circuit, whose second lead is connected to the first lead of the first element being checked, as well as a data processing means, the outputs of all the operational amplifiers being connected to an input of the data processing means.

7 Claims, 4 Drawing Figures

DEVICE FOR MEASURING AND CHECKING PARAMETERS OF ELECTRIC CIRCUIT ELEMENTS

The present invention relates to means for measuring and checking electric circuit parameters and, more specifically, to a device for measuring and checking parameters of electric circuit elements. The proposed device is used for measuring and checking such complicated electric circuits as radioelectronic circuits, as well as for detecting faults in such circuits by measuring and checking parameters of elements of which a circuit is composed.

In the prior art the foregoing problem has normally been solved by removing either partially or completely an element being checked from the circuit. A measuring instrument is then connected to leads of the element; if the element is in good condition, it is re-installed in the circuit.

This method has a number of disadvantages. For instance, it is time-consuming and demands high skill on the part of operators. In addition, mistakes which may be made by an operator and the necessity to detach circuit elements to be measured may affect the characteristics of the circuit.

There is known a measuring device which is used in the main for measuring and checking parameters of passive bipolar elements of electric circuits. This applies, in particular, to measuring the resistance of resistors, which make up a closed circuit, without removing them from the circuit. The device under review has an operational amplifier whose negative feedback circuit is intended to be connected to electrodes of a resistor to be measured, a common conductor of the operational amplifier being connected to one of the elements of the closed circuit unconnected to the resistor being measured. A calibration voltage source is connected to the input of the operational amplifier via a calibrated resistor.

The operational amplifier can lower the potential at its input to a value close to the potential of the common conductor. For this reason, the current flowing through the components of an electric circuit, which are interposed between the electrodes of a resitor being measured, which resistor is connected to the input of the operational amplifier, and an element of the electric circuit being checked, to which there is connected the common conductor of the operational amplifier, is reduced to extremely low limits, whereby there is produced what may be referred to as a "break" in the electric circuit.

Thus, through the resistor being measured there flows a current of a fixed value determined by the value of the calibration resistance and the voltage amplitude of the calibration voltage source connected to the input of the operational amplifier. The voltage drop across the resistor being measured is proportional to its resistance value and is independent of the parameters of the remaining electric circuit components placed in parallel with said resistor.

Generally, the device under review makes it possible to measure the complex resistance or conductivity of such bipolar circuit components as resistors, capacitors, and inductance coils. It is also applicable for measuring the resistance or conductivity of semiconductor diode or transistor junctions.

This device, however, has an important drawback. If the resistances of the components of the electric circuit being measured, interposed between the common conductor and the input of the operational amplifier, are small, the operational amplifier loses its operating stability.

The device under review has another disadvantage. If the resistance of the components of the electric circuit being measured, interposed between the output and the common conductor of the operational amplifier, are small, this may result in overloading the operational amplifier, since the components in question are the load of said amplifier.

The foregoing disadvantages considerably limit the sphere of application of the device which can only be used for measuring resistances within certain limits.

There is another version of the foregoing device for measuring and checking parameters of electric circuit components.

This second device has a testing signal source whose output is intended to be connected to a first electrode of a components to be measured, and an operational amplifier having a calibrated element in its feedback circuit, whose input is intended to be connected to a second electrode of the component being measured, the common conductor of the operational amplifier being connected to that of the testing signal source and to one of the elements of the electric circuit being checked, unconnected to the component being measured. The device under review also has a data processing means whose inputs are connected to the output of the operational amplifier and the output of the testing signal source.

The device also makes use of the capability of an operational amplifier to lower the potential at the input to a value close to the potential of the common conductor and thus produce a "break" in the electric circuit being checked at the portion between the input of the operational amplifier and its common conductor.

Applied to the circuit element being measured is voltage determined by the value of a testing signal. The current the operational amplifier's feedback circuit is proportional to the resistance value of the circuit element being measured and is independent, within certain limits, of the characteristics of the other components of the circuit being checked.

The basic disadvantage of this device is similar to that of the device that has been described above. If the resistances of the components of the circuit being checked, interposed between the input and the common conductor of the operational amplifier, are small, the operational amplifier loses its operating stability.

The device under discussion has another disadvantage. If the resistances of the electric circuit components being checked, interposed between the first electrode of the element being measured and the electric circuit element whereto there is connected the common conductor of the operational amplifier, are small, this may lead to overloading the testing signal source; if the testing signal source is powerful enough, the foregoing factor may lead to impermessible power dissipation among the components of the electric circuit being checked.

The above-mentioned disadvantages account for the fact that the device under review can only measure resistance within certain limits.

The application of this device is further limited by the resistance of the feedback circuit of the operational amplifier, which must not be lower than the resistance of the operational amplifier's rated load.

All foregoing devices have a disadvantage in common to they do not make it possible to measure parameters of the multipolar elements, for example, transistors, as these devices are applicable for measuring only the conductivity or the resistance between the two electrodes of an element of an electric circuit being checked. The third common conductor is intended to produce a "break" in the electric circuit in parallel with said two electrodes. Thus, the only characteristic of a multipolar element that can be measured with the aid of the aforementioned devices is the resistance between any two of its electrodes. The known devices under review cannot measure parameters of a multipolar element, which determine the element's operation, for example, such parameters as gain and transmission factor.

Another typical disadvantage of all the foregoing devices is the fact that in the course of one operation it is only possible to measure the parameters of one bipolar element of an electric circuit being checked.

It is an object of the present invention to provide a device for measuring and checking parameters of electric circuit elements, which make it possible to measure and check parameters of multipolar elements determining the operation of these elements, i.e., such parameters as the gain and transmission factors.

It is another object of the present invention to provide a device which makes it possible to measure and check, in the course of the operation, parameters of several bipolar electric circuit elements.

It is still another object of the present invention to provide a device which would make it possible to measure parameters of any element (active and passive, linear and non-linear), as well as measure and check electric circuit elements whose parameters vary within broad limits.

The foregoing and other objects of the present invention are attained by providing a device for measuring and checking parameters of elements of electric circuits comprising at least three elements making up a closed loop, which device has a testing signal source whose output is intended to be connected to a first electrode of a first element being measured, a first operational amplifier with a calibrated element in its feedback circuit, whose input is intended to be connected to a second electrode of the first element being checked, a common conductor of the first operational amplifier being connected to a common conductor of the testing signal source, and a data processing means whose inputs are electrically coupled to the output of the first operational amplifier and the output of the testing signal source, said device being further provided, according to the invention, with a first group of auxiliary operational amplifiers whose number is equal to that of the remaining electrodes of the first element being measured, the inputs of all these auxiliary amplifiers being intended to be connected to a respective auxiliary electrode of the first element being checked, and at least one auxiliary operational amplifier of a second group, whose input is intended to be connected to a first lead of at least one second element of the electric circuit, whose second lead is directly connected to the first electrode of the first element being checked, the outputs of all the auxiliary amplifiers being electrically coupled to the data processing means, the common conductors of all the auxiliary operational amplifiers being connected to a common conductor of the testing signal source.

While simultaneously checking the first and second elements of an electric circuit, whose second leads are directly connected to the first electrode of the first element being checked, it is expedient that the number of the auxiliary amplifiers of the second group be equal to the number of the second elements the input of each auxiliary amplifier of the second group being intended for connection to each respective first lead of said second element.

In checking only one first electric circuit element, it is expedient to use one auxiliary operational amplifier of the second group, its input being intended for connection to all the first electrodes of the second elements of the electric circuit, whose second electrodes are directly connected to the first electrode of the first element being checked.

It is desirable that the calibrated element included in the feedback circuit of the operational amplifier be constructed in the form of inverting and non-inverting links to transform the feedback resistance, the outputs of the inverting links for transforming the feedback resistance being connected to the non-inverting input of a respective operational amplifier, the outputs of the non-inverting links for transforming the feedback resistance being connected to the inverting input of the same operational amplifier, the inputs of the inverting and non-inverting links for transforming the feedback resistance being connected to the output of the operational amplifier.

It is advisable that the inverting link for transforming the feedback resistance should have an operational link amplifier and a first calibrated resistor interposed between the output and the inverting input of the operational link amplifier whose output is connected via a second calibrated resistor to the output of the inverting link for transforming the feedback resistance, the input of the inverting link for transforming the feedback resistance being connected via a third calibrated resistor to the inverting input of the operational link amplifier.

It is equally advisable that the non-inverting link for transforming feedback resistance be provided with an operational link amplifier and a first calibrated resistor interposed between the output and the inverting input of the operational link amplifier whose output is connected via a second calibrated resistor to the output of this non-inverting link for transforming feedback resistance, the input of this non-inverting link for transforming feedback resistance being connected via a third calibrated resistor to the non-inverting input of the operational amplifier of this link.

It is expedient that the non-inverting links for transforming feedback resistance form a series alternating circuit, wherein the outputs of all the links for transforming feedback resistance are combined, the output of each operational amplifier of each non-inverting link for transforming feedback resistance being connected to the input of the following non-inverting link for transforming feedback resistance, the output of whose operational amplifier is connected to the input of the following non-inverting link for transforming feedback resistance.

Other objects and advantages of the present invention will become more apparent from the following detailed description of preferred embodiments thereof taken in conjunction with the accompanying drawings, wherein.

Figure 1:
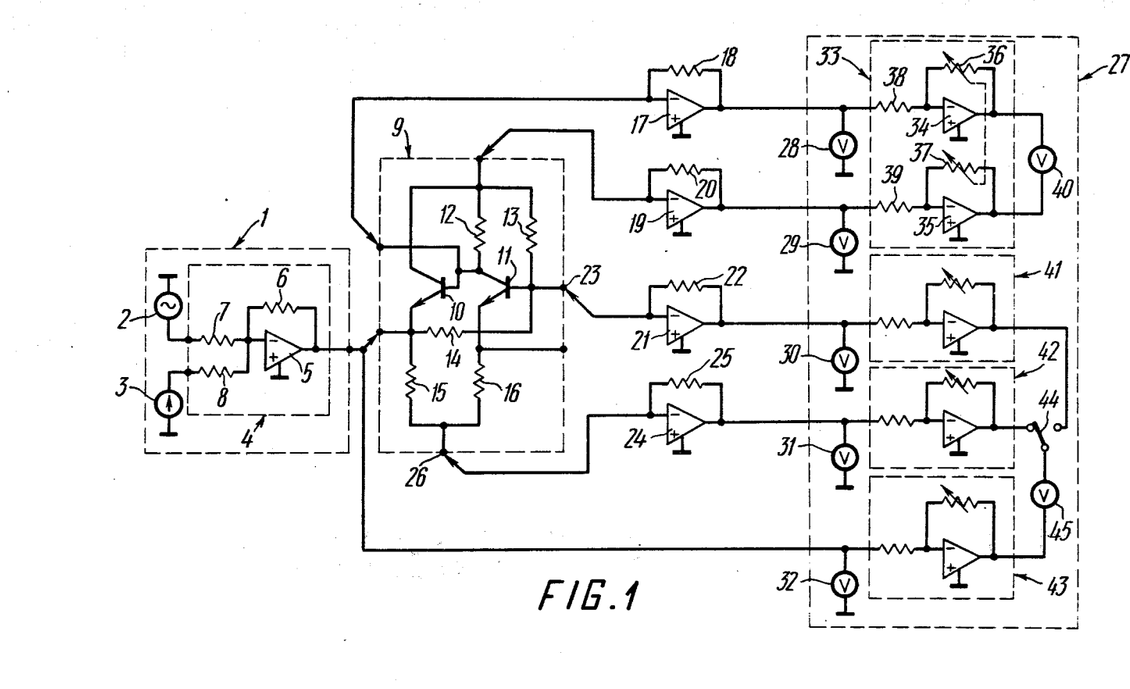
FIG. 1 is a circuit diagram of a device for measuring and checking parameters of electric circuit elements and simultaneously measuring and checking parameters of elements directly connected to an element being measured, in accordance with the invention.

Referring now to the accompanying drawings, the proposed device for measuring and checking parameters of elements of composite electric circuits, shown in FIG. 1, comprises a testing signal source 1 designed in the conventional manner. The testing signal source 1 comprises an alternating voltage generator 2 and a direct voltage generator 3, the outputs of said generators being connected to inputs of a summing amplifier 4 built in conventional manner around an amplifier 5 and resistors 6, 7 and 8. An output of the testing signal source 1 is intended to be connected to one of the electrodes of an element of a composite electric circuit 9 which is to be checked.

In the embodiment under review, the composite electric circuit 9 includes a transistor 10, a transistor 11, and resistors 12, 13, 14, 15, and 16. In the composite electric circuit 9 of FIG. 1, the ouput of the testing signal source 1 is connected to the emitter electrode of the transistor 10 being checked. An input of a first operational amplifier 17, which amplifier is constructed in conventional manner and has a calibrated element 18 placed in the feedback circuit thereof, is intended for connected to the electrode of the transistor 10 being checked.

Connected to the collector electrode of the transistor 10 being checked is an input of an auxiliary operational amplfier 19 having a calibrated element 20 in its feedback circuit.

An input of an auxiliary operational amplifier 21 having a calibrated element 22 in its feedback circuit is intended for connection to a lead 23 of the resistor 14 whose second lead is connected to the emitter of the transistor 10 being checked.

An input of an auxiliary operational amplifier 24 having a calibrated element 25 in its feedback circuit is intended for connection to a lead 26 of the composite electric circuit 9 being checked, to which lead 26 there is connected the first electrode of the resistor 15.

The second electrode of the resistor 15 is directly connected to the emitter electrode of the transistor 10 being checked.

The outputs of the testing signal source 1, of the first operational amplifier 17, and of all the auxiliary operational amplifiers 19, 21 and 24 are connected to a data processing means 27 constructed in conventional manner and including voltmeters 28, 29, 30, 31 and 32, connected to which are the respective outputs of the operational amplifiers 17, 19, 21 and 24, and the output of the testing signal source 1.

The data processing means 27 further includes a controlled divider unit 33 comprising amplifiers 34 and 35, adjustable resistors 36 and 37, and resistors 38 and 39. Connected to outputs of the controlled divider unit 33 is a zero indicator 40. Inputs of said unit 33 are connected to the voltmeters 28 and 29.

The inputs of controlled divider units 41, 42 and 43, built around the same elements as the unit 40, are connected to the voltmeters, 30, 31 and 32, respectively. The outputs of the units 41 and 42 are connected via a switch 44 to an input of a zero indicator 45 whose other input is connected to an output of the controlled divider unit 43.

Figure 2:
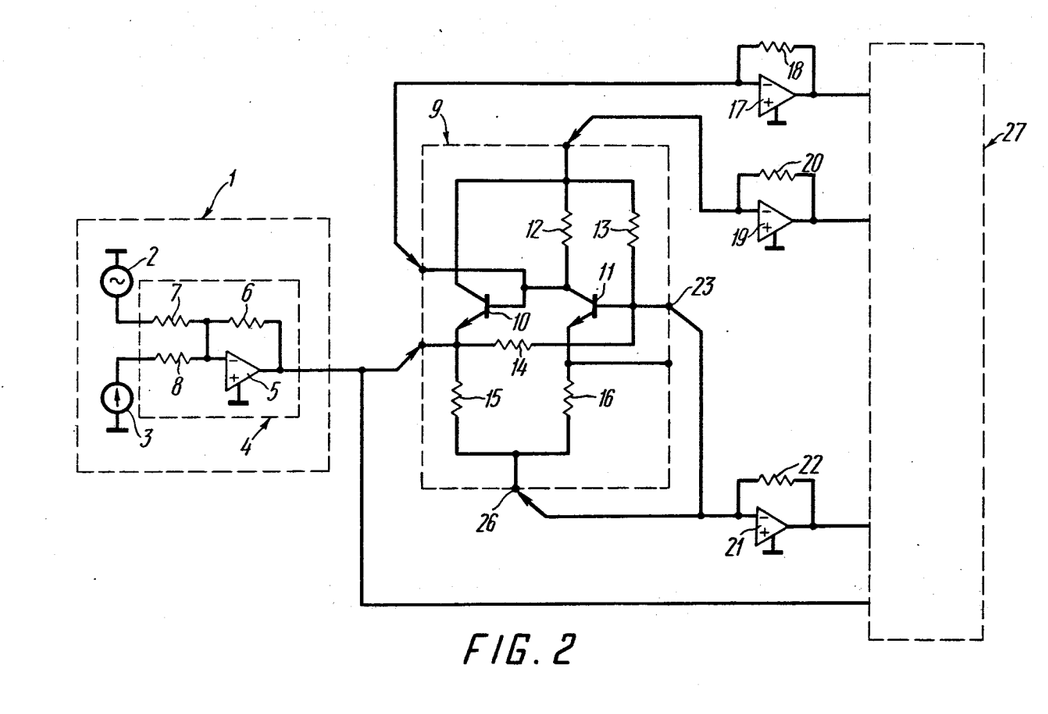
FIG. 2 is a circuit diagram of another embodiment of the device for measuring and checking parameters of the electric circuit elements in accordance with the invention.

The device for element-by-element measuring of parameters of elements of composite electric circuits, shown in FIG. 2, differs from the device of FIG. 1 in that the input of the auxilary operational amplifier 21 is connected to the first electrodes of the resistors 14 and 15, whose second electrodes are connected to the emitter electrode of the transistor 10 being checked. In this case there is no auxiliary operational amplifier 24 (FIG. 1).

Figure 3:
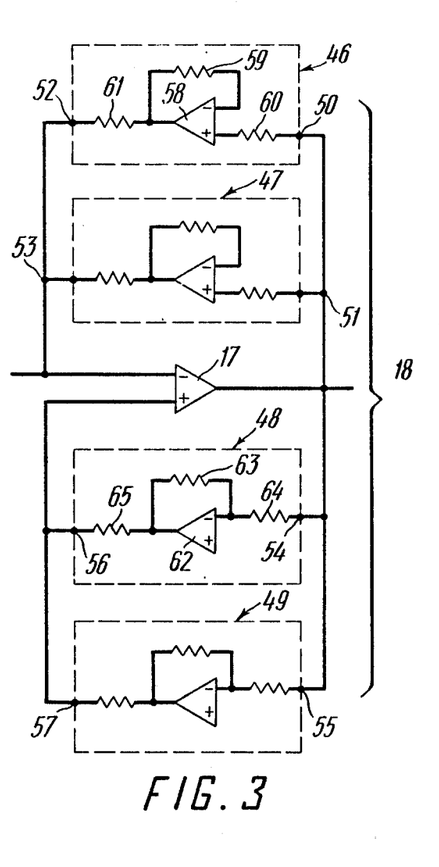
FIG. 3 is a circuit diagram of an operational amplifier with parallel-connected links for transforming feedback resistance of the operational amplifier in accordance with the invention.

FIG. 3 shows a circuit diagram of the first operational amplifier 17, wherein the calibrated element 18 in the feedback circuit comprises parallel-connected links 46, 47, 48 and 49 for transforming feedback resistance.

Inputs 50 and 51 of the non-inverting links 46 and 47 for transforming feedback resistance are connected to the output of the operational amplifier 17.

Outputs 52 and 53 of said non-inverting links 46 and 47 are interconnected and connected to an inverting input of the operational amplifier 17.

Inputs 54 and 55 of the inverting links 48 and 49 are also connected to the output of the operational amplifier 17. Outputs 56 and 57 of the links 48 and 49 are connected to a non-inverting input of the operational amplifier 17.

The non-inverting link 46 for transforming feedback resistance comprises an operational amplifier 58 with a calibrated resistor 59 interposed between an output and an inverting input of the operational amplifier 58, and two more calibrated resistors 60 and 61, the first being interposed between a non-inverting input of the operational amplifier 58 and the input 50 of the non-inverting link 46 for transforming feedback resistance, whereas the resistor 61 is interposed between the output of the operational amplifier 58 and the output 52 of the non-inverting link 46.

The inverting link 48 further includes an operational amplifier 62 with a calibrated resistor 63 interposed between an inverting input and an output of the operational amplifier 62, and two calibrated resistors 64 and 65.

The calibrated resistor 64 is interposed between the input 54 of the link 48 for transforming feedback resistance and the inverting input of the operational amplifier 62. The calibrated resistor 65 is interposed between the input 56 of the inverting link 48 for transforming feedback resistance and the output of the operational amplifier 62.

Figure 4:
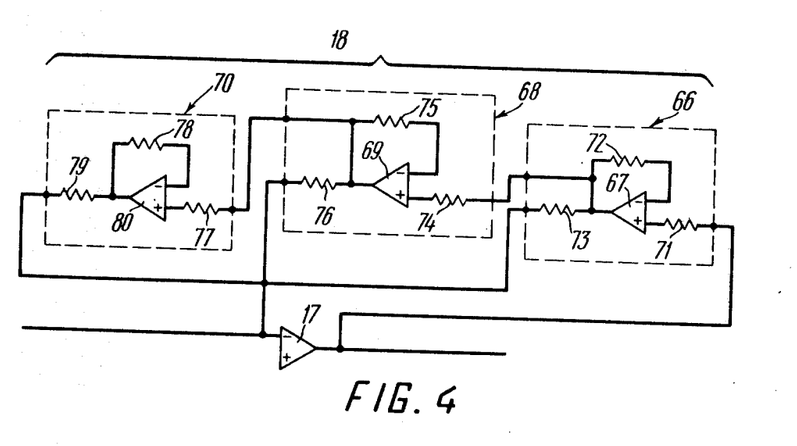
FIG. 4 is a circuit diagram of an operational amplifier with a different manner in connection of links for transforming feedback resistance in accordance with the invention.

FIG. 4 shows a circuit diagram of the operational amplifier 17 with a the calibrated element 18 in its feedback circuit, which is a series circuit made up of non-inverting links for transforming feedback resistance.

The output of the operational amplifier 17 is connected to an input of a non-inverting link 66. An output of an operational amplifier 67 incorporated in said non-inverting link 66 is connected to an input of a non-inverting link 68 for transforming feedback resistance. An output of an operational amplifier 69 of said link 68 is connected to an input of a following non-inverting link 70 for transforming feedback resistance.

The outputs of the links 66, 68 and 70 are interconnected and connected to the inverting input of the operational amplifier 17.

The non-inverting link 66 further includes calibrated resistors 71, 72 and 73. The non-inverting link 68 further includes calibrated resistors 74, 75 and 76. The non-inverting link 70 includes calibrated resistors 77, 78 and 79 and an operational amplifier 80.

The proposed device for measuring and checking parameters of electric circuit elements operates as follows.

In measuring a parameter of the transistor 10 such as the static current amplification factor in operating with a common emitter, which factor is determined by the ratio between the collector and base currents, the testing signal source 1 is connected to the emitter electrode of the transistor 10 being checked. The testing signal is d.c. voltage which produces currents in the transistor 10 being checked and the elements of the composite electric circuit 9, connected to the emitter electrode of the transistor (the resistors 14 and 15). Said currents are compensated at the inputs of the operational amplifiers 17, 19, 21 and 24 by currents flowing through the calibrated elements 18, 20, 22 and 25 placed in the feedback circuits of said operational amplifiers 17, 19, 21 and 24.

The potentials at the inputs of the operational amplifiers 17, 19, 21 and 24 with their feedback circuits are, on the one hand, reduced to extremely low values close to the common conductor potential, and, on the other hand, are levelled by appropriately selecting the transmission factors of the operational amplifiers 17, 19, 21 and 24. Hence, there is practically no current in the remaining elements of the composite electric circuit 9 being checked, which elements are connected to the collector and emitter electrodes of the transistor 10 being checked, so that parameters of said elements have no effect upon measuring the parameters of said transistor 10.

The voltmeter 28, indicates the current through the collector junction of the transistor 10 being checked the voltmeter 29, the current through the emitter junction of the transistor 10 being checked, the voltmeters 30 and 31 the currents through the resistor 14 and the resistor 15, respectively.

By changing the division coefficient in the controlled divider unit 33 and following the indications of the zero indicator 40, there is reached equality if voltages at the outputs of the controlled divider unit 33. The parameter being measured (for example, the current amplification factor) is determined from the ratio between the resistances of the resistors of the unit 33, multiplied by the ratio between the resistances of the calibrated elements 20 and 18.

The parameters of the resistors 14 and 15 of the composite electric circuit 9 are measured simultaneously with the foregoing operations and in the same way.

The resistance value of the resistor 14 is the resistance value of the calibrated element 22 multiplied by the ratio between the transmission factors of the controlled divider unit 41 and the transmission factor of the controlled divider unit 43.

The resistance value of the resistor 15 is measured in the same way. This value is equal to the resistance value of the calibrated element 25 multiplied by the ratio between the transmission factor of the controlled divider unit 42 and the transmission factor of the controlled divider unit 43.

In measuring the differential parameters of the transistor 10, the signal of the testing signal source 1 is the sum total of the d.c. and a.c. voltages.

The process of measurement is similar to what has been described above. At the outputs of the operational amplifiers 17 and 19 there are measured the values of variable components of the base and collected currents. With the aid of the controlled divider unit 33 there is determined the differential current amplification factor of the transistor 10.

Other parameters of the transistors, as well as parameters of all the remaining elements of the composite electric circuit being checked are measured by switching the output of the testing signal source 1, the input of the first operational amplifier 17, and the inputs of the auxiliary operational amplifiers 19, 21 and 24 of both groups. In the course of each individual measuring operation there are measured parameters of all the elements that are directly connected to the element of the composite electric circuit 9, whereto there is connected the testing signal source 1. The number of auxiliary operational amplifiers required for the process is determined by the number of elements to be checked.

In the device for measuring parameters of electric circuit elements, shown in FIG. 2, the input of the operational amplifier 21 is connected to all the leads of the elements of the composite electric circuit being checked (the elements 23 and 26 of the resistors 14 and 15), whose other leads are connected directly to the emitter electrode of the transistor 10 being checked. In the course of operation there is observed the same de-energizing effect of the elements of the composite electric circuit 9, which are directly connected to the collector and emitter electrodes of the transistor 10 being checked. Yet in this case it is impossible to measure parameters of the resistors 14 and 15, for said resistors 14 and 15 are placed in parallel.

The device of FIG. 2 only provides for element-by-element checking.

In measuring and checking high-conductivity composite electric circuits (or low-resistance circuits), as well as circuits incorporating active elements (transistors) whose parameters are to be measured in the presence of high currents, the measurements will be accurate only if the entire linear range of the operational amplifiers is used.

With regard to the operational amplifiers this requirement means a substantial increase in the rated output power of the operational amplifiers (or an increase in the output current of the operational amplifiers). It should be borne in mind, however, that in modern microcircuit operational amplifiers the output current is never in excess of a few tens of milliamperes. It is possible, however, to use operational amplifiers with limited output currents and obtain high accuracy of measuring and checking parameters of high-current active elements and high-conductivity elements without removing these elements from electric circuits. For this purpose, the proposed device for measuring parameters of elements of composite electric circuits includes links for transforming feedback resistances, the number of such links being altered depending upon the value of the parameter being measured.

The operation of the links for transforming feedback resistance is illustrated in FIG. 3. According to FIG. 3, the function of the calibrated element 18 in the feedback circuit of the operational amplifier 17 is performed by the four links 46, 47, 48 and 49 for transforming feedback resistance.

The two non-inverting links 46 and 47 are incorporated in the negative feedback circuit of the operational amplifier 17. The inverting links 48 and 49 are included in the positive feedback circuit of said amplifier 17.

Due to the fact that each inverting link 48 and 49 changes the phase of the feedback circuit to transform the feedback resistance, the sign of the total feedback of all the four links remains negative.

Consider now operation of the link 46 for transforming feedback resistance; assuming that the links 47, 48 and 49 are disconnected.

In this case the voltage at the output of the operational amplifier 58, with sufficiently great amplification factors of the main operational amplifier 17 and the operational amplifier 58 incorporated in the link 46 for transforming feedback resistance of the main operational amplifier 17, is expressed as follows:

$$V_{58} = - U_{50} \frac{1}{Z_{60}} \cdot \frac{Z_{61} \cdot Z_{59}}{Z_{60}}.$$

Thus, the entire circuit of the link 46 is equivalent to resistance whose value is $$Z_{46} = \frac{Z_{61} \cdot Z_{59}}{Z_{60}}.$$

The resistance value of $Z_{46}$ is limited due to the following considerations:

1. The resistance value of $Z_{61}$ is the load of the operational amplifier 58 and cannot be lower than a predetermined nominal value.

2. The resistance value of $Z_{59}$ may be selected to be considerably greater than $Z_{61}$, and the upper limit of $Z_{61}$ (as of $Z_{59}$) is determined by the drift characteristics of the operational amplifiers.

Hence, the value of current at the output of the main operational amplifier 17 is determined by the resistance value of $Z_{60}$, whereas the feedback amount is determined by the resistance value of $Z_{46}$.

With parallel connection of the links 46, 47, 48 and 49, their total equivalent resistance is equal to the resistance of their equivalent resistors placed in parallel.

If in all the links 46, 47, 48 and 49 the calibrated resistors are of an equal value, the total equivalent resistance amounts to one fourth of the equivalent resistance of one link, but the load for that link increases four-fold. If the links for transforming feedback resistance are interconnected in series, as is shown in FIG. 4, the total equivalent resistance is expressed as follows:

$$Z = \frac{1}{\frac{1}{Z_{66}} + \frac{1}{Z_{68}} \cdot \frac{Z_{72}}{Z_{71}} + \frac{1}{Z_{70}} \cdot \frac{Z_{72}}{Z_{71}} \cdot \frac{Z_{75}}{Z_{74}}};$$

where $Z$ is the total equivalent resistance of three series placed links for transforming feedback resistance;

$Z_{66}$ is the equivalent resistance of the non-inverting link 66 for transforming feedback resistance, equal to $$Z_{66} = \frac{Z_{73} \cdot Z_{72}}{Z_{71}};$$

$Z_{68}$ is the equivalent resistance of the non-inverting link 68 equal to $$Z_{68} = \frac{Z_{76} \cdot Z_{75}}{Z_{74}};$$

$Z_{70}$ is the equivalent resistance of the non-inverting link 70 equal to $$Z_{70} = \frac{Z_{79} \cdot Z_{78}}{Z_{77}}.$$

If $\frac{Z_{72}}{Z_{71}} = \frac{Z_{75}}{Z_{74}} = \frac{Z_{78}}{Z_{77}} = 1$, then $Z = \frac{1}{3} \cdot Z_{66}$.

At the same time the load of the main operational amplifier 17 is not changed with a changing number of links.

Links for transforming feedback reistance via calibrated resistors, which are employed in the feedback circuit of the operational amplifier, are advantageous in that they provide for sufficiently great fixed points in the feedback circuit of the operational amplifier without loading the output of the operational amplifier. Thus, it is possible to use the entire linear range of the operational amplifier with any current level in elements of composite electric circuits being checked.

What is claimed is:

1. A device for measuring and checking the parameters of at least one element of an electric circuit having at least three elements forming a closed loop, said device comprising: a testing signal source having an output for connection to a first lead of a first element being checked; a first operational amplifier with a calibrated element in its feedback circuit and having an input for connection to a second lead of said first element being checked, a common condcutor of the first operational amplifier being connected to a common conductor of said testing signal source; a first group of auxiliary operational amplifiers whose number is equal to the number of the remaining additional leads of said first element being checked, the input of each said auxiliary operational amplifier being intended for connection to the respective additional lead of said first element being checked; at least one auxiliary operational amplifier of a second group, having an input for connection to a first lead of at least one second element of said electric circuit, the second element having a second lead connected to said first lead of said first element being checked; a data processing means having inputs connected respectively to the outputs of all of said operational amplifiers and to the output of said testing signal source.

2. The device as claimed in claim 1, wherein for simultaneously checking said first element and said second elements of the electric circuit, the second leads of the second elements are interconnected to the first lead of said first element being checked, the number of said auxiliary amplifiers of the second group is equal to the number of said second elements, the input of each said auxiliary amplifier of the second group being intended for connection to each first lead of the respective second element.

3. The device as claimed in claim 1, wherein for checking only one first element of the electric circuit, provision is made for one said auxiliary operational amplifier of the second group, the auxiliary operational amplifier having an input intended for connection to all the first leads of said second elements of the electric circuit, wherein the second leads of the second elements are directly connected to the first lead of said first element being checked.

4. The device as claimed in claim 1, wherein the calibrated element in the feedback circuit of each said operational amplifier is constructed in the form of inverting and non-inverting links for transforming feedback resistance, outputs of said inverting links for transforming feedback resistance being connected to a non-inverting input of the respective operational amplifier, outputs of said non-inverting links for transforming feedback resistance being connected to an inverting input of said same operational amplifier, inputs of said inverting and non-inverting links for transforming feedback resistance being connected to the output of said operational amplifier.

5. The device as claimed in claim 4, wherein the inverting link for transforming feedback resistance is provided with an operational link amplifier and a first calibrated resistor interposed between the output and the inverting input of said operational amplifier wherein said operational amplifier has an output connected via a second calibrated resistor to the output of this inverting link for transforming feedback resistance, the input of said inverting link for transforming feedback resistance being connected via a third calibrated resistor to the inverting input of said operational link amplifier.

6. The device as claimed in claim 4, wherein said non-inverting link for transforming feedback resistance is provided with an operational link amplifier and a first calibrated resistor interposed between the output of the inverting input of said operational link amplifier, the output of said operational link amplifier being connected via a second calibrated resistor to the output of this non-inverting link for transforming feedback resistance, the input of this non-inverting link for transforming feedback resistance being connected via a third calibrated resistor to the non-inverting input of said operational amplifier of this link.

7. The device as claimed in claim 6, wherein the calibrated element has said non-inverting links for transforming feedback resistance making up a series alternating circuit, wherein the outputs of all said links for transforming feedback resistance are interconnected, the output of each said operational amplifier of the non-inverting link for transforming feedback resistance being connected to the input of the following non-inverting link for transforming feedback resistance, the output of said operational amplifier of said link being connected to the input of the following non-inverting link for transforming feedback resistance.

* * * * *